United States Patent
Xie et al.

(10) Patent No.: US 10,008,577 B2
(45) Date of Patent: Jun. 26, 2018

(54) METHODS OF FORMING AN AIR-GAP SPACER ON A SEMICONDUCTOR DEVICE AND THE RESULTING DEVICE

(71) Applicant: GLOBALFOUNDRIES Inc., Grand Cayman (KY)

(72) Inventors: Ruilong Xie, Niskayuna, NY (US); Min Gyu Sung, Latham, NY (US); Chanro Park, Clifton Park, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/225,152

(22) Filed: Aug. 1, 2016

(65) Prior Publication Data

US 2018/0033863 A1 Feb. 1, 2018

(51) Int. Cl.
| | |
|---|---|
| *H01L 27/00* | (2006.01) |
| *H01L 21/00* | (2006.01) |
| *H01L 29/49* | (2006.01) |
| *H01L 23/535* | (2006.01) |
| *H01L 29/06* | (2006.01) |
| *H01L 29/40* | (2006.01) |
| *H01L 21/768* | (2006.01) |

(52) U.S. Cl.
CPC ...... *H01L 29/4991* (2013.01); *H01L 21/7682* (2013.01); *H01L 21/76805* (2013.01); *H01L 21/76897* (2013.01); *H01L 23/535* (2013.01); *H01L 29/0653* (2013.01); *H01L 29/401* (2013.01)

(58) Field of Classification Search
CPC .......... H01L 21/76805; H01L 21/7682; H01L 21/76897; H01L 29/4991; H01L 29/0653; H01L 29/401; H01L 23/535
See application file for complete search history.

(56) References Cited

U.S. PATENT DOCUMENTS

| 6,534,389 | B1 * | 3/2003 | Ference | ............ H01L 21/76895 257/E21.507 |
|---|---|---|---|---|
| 6,680,514 | B1 * | 1/2004 | Geffken | .............. H01L 21/2885 257/368 |
| 8,871,582 | B2 * | 10/2014 | Pham | ................... H01L 29/4232 438/149 |
| 2014/0035010 | A1 * | 2/2014 | Cai | ...................... H01L 29/6653 257/288 |
| 2014/0110798 | A1 * | 4/2014 | Cai | ........................ H01L 29/78 257/410 |

\* cited by examiner

*Primary Examiner* — Dale E Page
*Assistant Examiner* — Quovaunda V Jefferson
(74) *Attorney, Agent, or Firm* — Amerson Law Firm, PLLC

(57) ABSTRACT

One illustrative method disclosed herein includes, among other things, forming a gate structure above an active region and an isolation region, wherein the gate structure comprises a gate, a first gate cap layer and a first sidewall spacer, removing portions of the first gate cap layer and the first sidewall spacer that are positioned above the active region, while leaving portions of the first gate cap layer and the first sidewall spacer positioned above the isolation region in place, wherein a plurality of spacer cavities are defined adjacent the gate, and forming a replacement air-gap spacer in each of the spacer cavities adjacent the gate and a replacement gate cap layer above the gate, wherein the replacement air-gap spacer comprises an air gap.

23 Claims, 15 Drawing Sheets

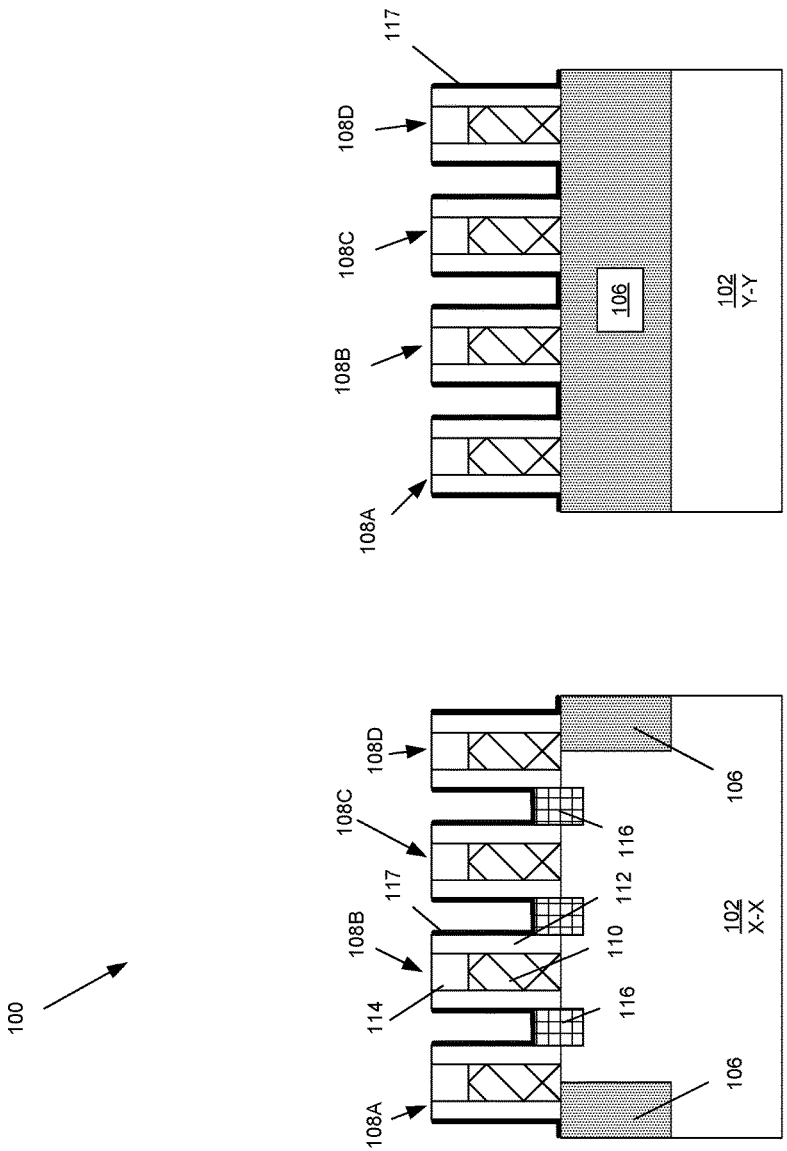

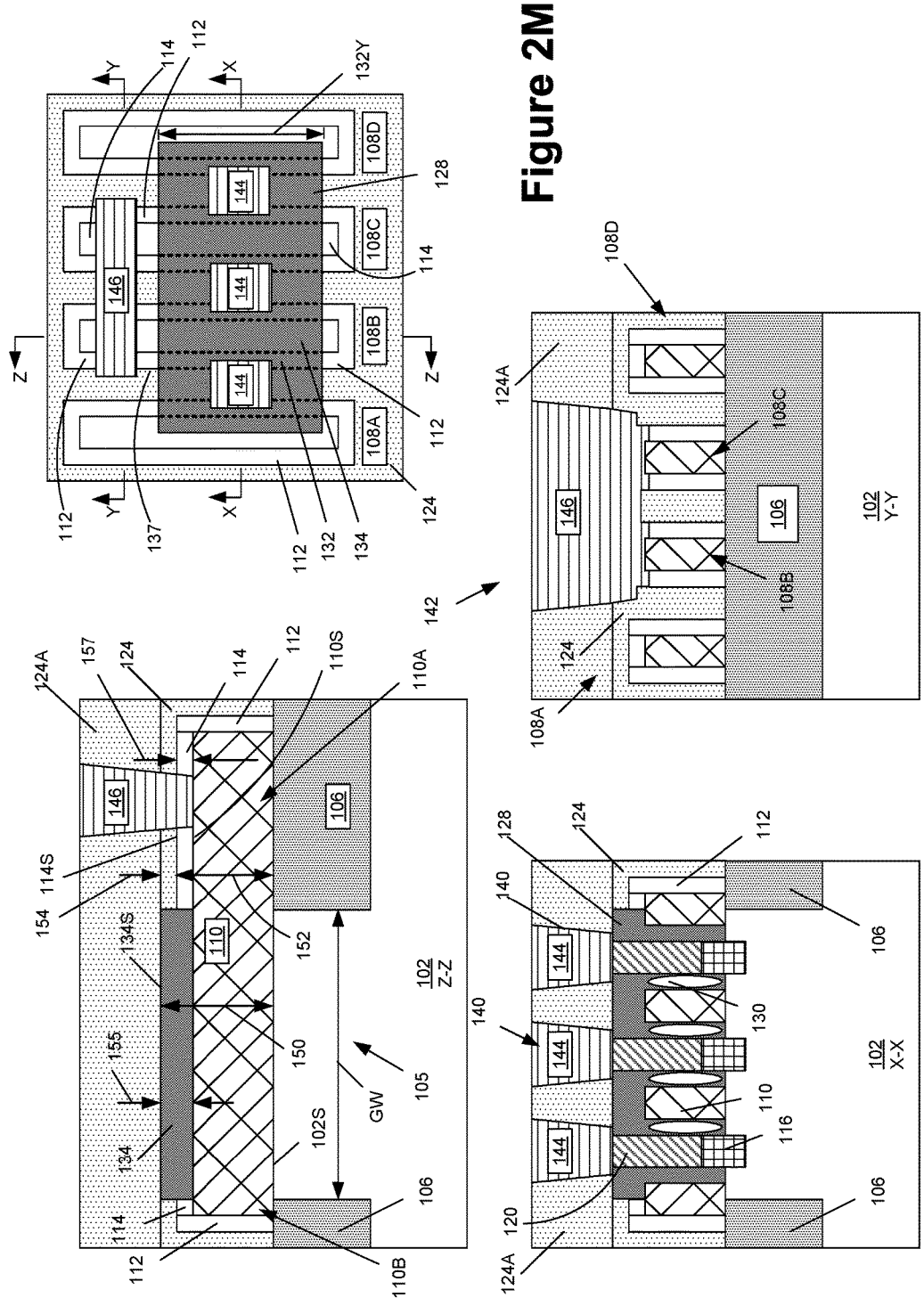

METHODS OF FORMING AN AIR-GAP SPACER ON A SEMICONDUCTOR DEVICE AND THE RESULTING DEVICE

BACKGROUND OF THE INVENTION

1. Field of the Invention

The present disclosure generally relates to the fabrication of integrated circuits, and, more particularly, to various methods of forming an air-gap spacer on a semiconductor device and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

FIG. 1 is a simplistic plan view of an illustrative prior art planar transistor 10 that contains a cross-sectional view (X-X) in the gate-length direction of the device 10 and a cross-sectional view (Y-Y) taken through a spacer 26 formed adjacent the gate structure 22 of the device. In general, the transistor device 10 comprises an illustrative gate structure 22, i.e., a gate insulation layer 22A and a gate electrode 22B, a gate cap layer 24 (e.g., silicon nitride), a sidewall spacer 26 (e.g., silicon nitride) and simplistically depicted source/drain regions 20. An isolation region 13 was formed in the substrate 12 so as to electrically isolate the device 10 from adjacent devices. Other layers of material, such as contact etch stop layers and the like, are not depicted in the drawings. Also depicted are illustrative raised epi source/drain regions 32 and self-aligned source/drain contact structures 36 which are sometimes referred to as so-called "trench silicide" (TS) structures. The gate cap layer 24 is formed above the gate structure 22 and the sidewall spacer 26 (e.g., silicon nitride) is formed adjacent the sidewalls of the gate structure 22 so as to electrically isolate the gate structure 22 and protect the gate structure 22 during subsequent processing operations that are preformed to complete the device 10. Also depicted are a plurality of so-called "CA contact" structures 14 for establishing electrical connection to the source/drain regions 20 of the device 10, and a gate contact structure 16, which is sometimes referred to as a "CB contact" structure, for establishing electrical contact to the gate structure 22. The CB gate contact 16 is typically positioned vertically above the isolation material 13 that surrounds the device 10, i.e., the CB gate contact 16 is typically not positioned above the active region defined in the substrate 12 by the isolation region 13. The self-aligned contacts 36, the CA contact structures 14 and the CB contact structure 16 are positioned in one or more layers of insulating material 30, e.g., silicon dioxide, a low-k material. The self-aligned contacts 36 are conductively coupled to the raised source/drain regions 32.

As noted above, the spacers 26 are typically made of silicon nitride which has a relatively high k value of, e.g., about 7-8. As a result of the physical configuration of the transistor 10, a gate-to-contact capacitor is defined, wherein the gate electrode 22 functions as one of the conductive plates of the capacitor, the self-aligned contact 36 functions as the other conductive plate of the capacitor and the spacer 26 is positioned between the two conductive plates. This gate-to-contact capacitor is parasitic in nature in that this capacitor must charge and discharge every time the device 10 is turned on and off, all of which results in delaying the switching speed of the device 10.

Device designers have made efforts to reduce the parasitic gate-to-contact capacitor. For example, some process flows have been developed for forming the spacer 26 of a material having a lower k value than that of silicon nitride so as to reduce the capacitance. Another technique that has been employed is to form air gaps or spaces in the spacer 26 so as to reduce the k value of the spacer. As shown in the cross-sectional views in FIG. 1, if an air gap 27 is formed in the spacer 26 around the entire perimeter of the gate structure 22, then when the opening 16A is formed in the gate cap layer 24 for the CB contact 16, metal material that is deposited to form the CB contact 16 may flow into the air gap 27, as indicated by the arrow 31. As a result, the capacitance-reducing purpose of the air gap 27 may be reduced or eliminated, the gate-to-contact capacitor may increase and, in a worst-case scenario, an electrical short circuit may be created between the gate structure 22 and the CB gate contact 16. One way device designers have tried to avoid this potential problem is to form a masking layer (not shown) that covers the area where the CB contact 16 will be formed when forming the air gap 27 in the remaining portions of the spacer 26. However, the formation of such an additional masking layer is expensive and leads to additional processing complexities.

The present disclosure is directed to various methods of forming an air-gap spacer on a semiconductor device and the resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming an air-gap spacer on a semiconductor device and the resulting devices. One illustrative method disclosed herein includes, among other things, forming an isolation region in a semiconductor substrate so as to define an active region in the substrate and forming a gate structure above the active region and the isolation region, wherein the gate structure comprises a gate, a first gate cap layer and a first sidewall spacer. In this example, the method further includes removing portions of the first gate cap layer and the first sidewall spacer that are positioned above the active region, while leaving portions of the first gate cap layer and the first sidewall spacer positioned above the isolation region in place, wherein a plurality of spacer cavities are defined adjacent the gate, and forming a replacement air-gap spacer in each of the spacer cavities adjacent the gate and a replacement gate cap layer above the gate, wherein the replacement air-gap spacer comprises an air gap.

One illustrative device disclosed herein includes, among other things, an isolation region that defines an active region in a semiconducting substrate, a gate structure comprising a gate, wherein a central portion of the gate is positioned above the active region and opposite ends of the gate are positioned above the isolation region, and a first solid sidewall spacer positioned adjacent the opposite ends of the gate that are positioned above the isolation region. In this example, the device further includes an air-gap spacer positioned adjacent each side of the central portion of the gate, the air-gap spacer being positioned above the active region and comprising an air-gap wherein opposite ends of the air-gap spacer abuts and engages the first solid sidewall spacer, a first gate cap layer that is positioned above portions of the gate that are positioned above the isolation region, and a second gate cap layer that is positioned above the portion of the gate positioned above the active region, wherein the second gate cap layer has a thickness that is greater than a thickness of the first gate cap layer.

BRIEF DESCRIPTION OF THE DRAWINGS

The disclosure may be understood by reference to the following description taken in conjunction with the accompanying drawings, in which like reference numerals identify like elements, and in which.

Figure 1:
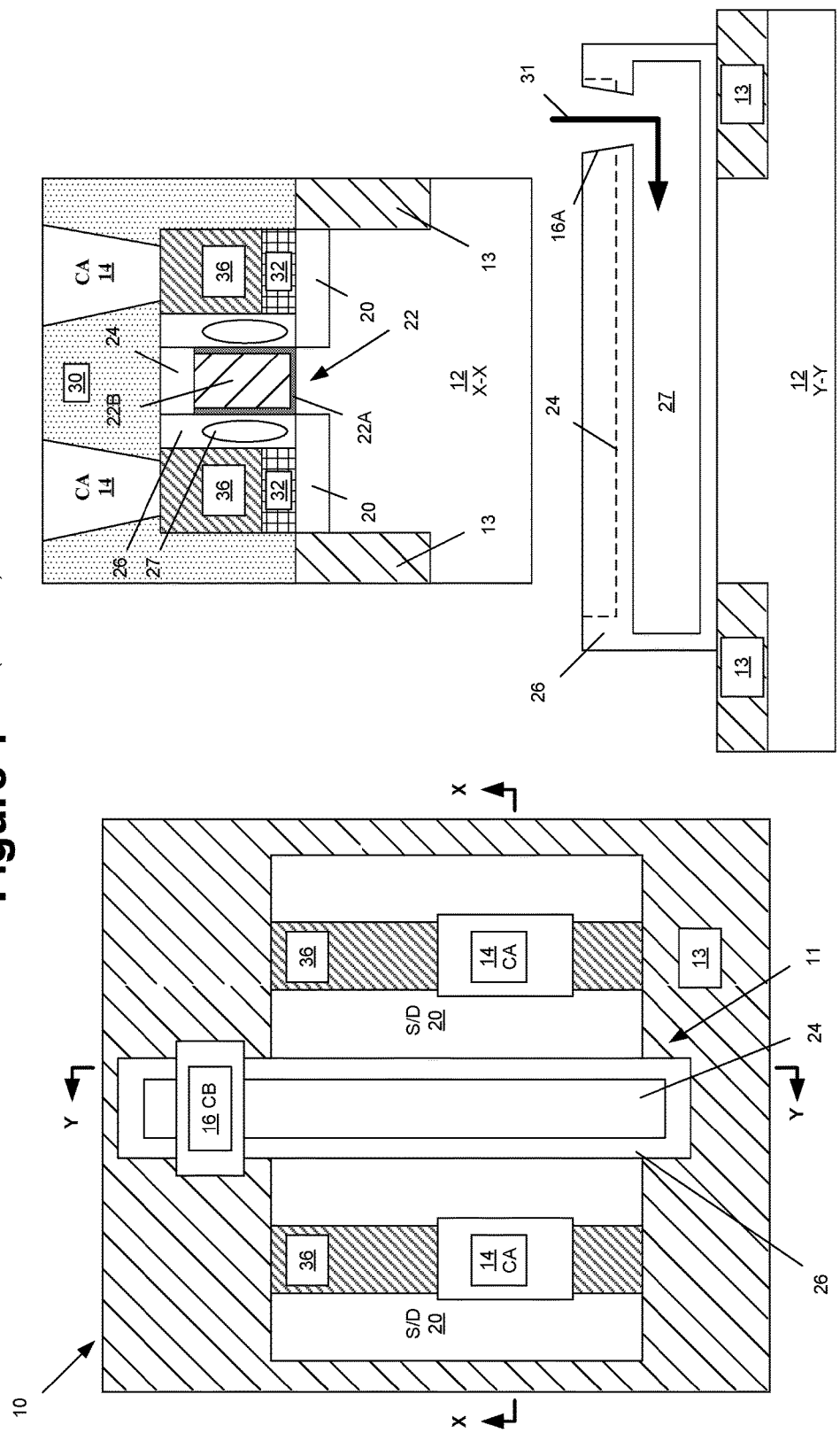
FIG. 1 is a simplistic depiction of an illustrative prior art transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to methods of forming an air-gap spacer on a semiconductor device and the resulting device. As will be readily apparent to those skilled in the art upon a complete reading of the present application, the present method is applicable to a variety of products, including, but not limited to, logic products, memory products, etc. Moreover, the methods disclosed herein may be employed when manufacturing a variety of different transistor devices, e.g., planar devices, FinFET devices, nanowire devices, etc. The present subject matter will be disclosed in the context of forming an integrated circuit product comprised of illustrative planar transistor devices. However, as will be appreciated by those skilled in the art after a complete reading of the present application, the methods and devices disclosed herein are not limited to use with planar transistor devices, e.g., they may be employed with, for example, FinFET devices. With reference to the attached figures, various illustrative embodiments of the methods and devices disclosed herein will now be described in more detail.

Figure 2A:
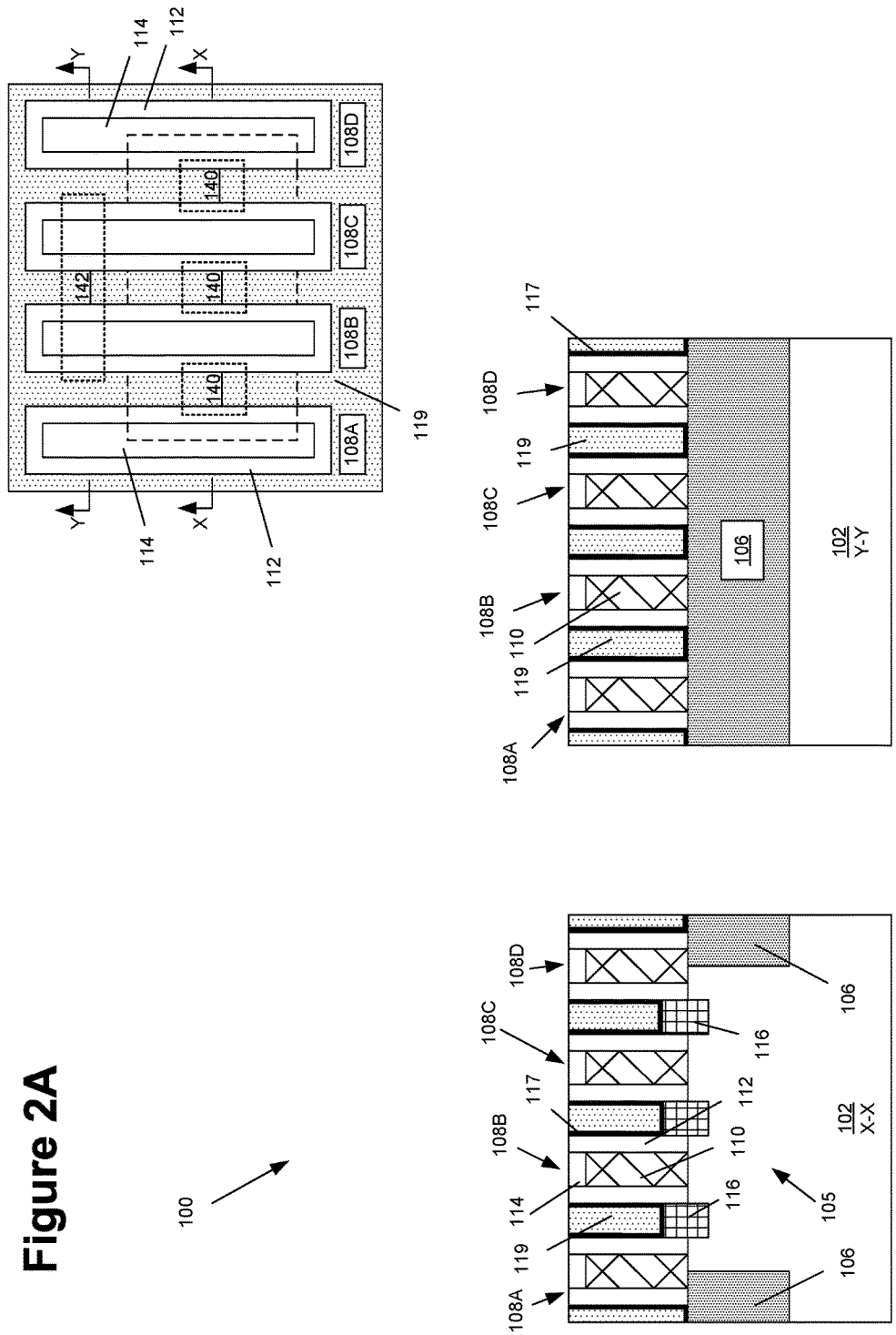
FIGS. 2A-2N depict various methods disclosed herein for forming an air-gap spacer on a semiconductor device and the resulting devices.
Figure 2C:
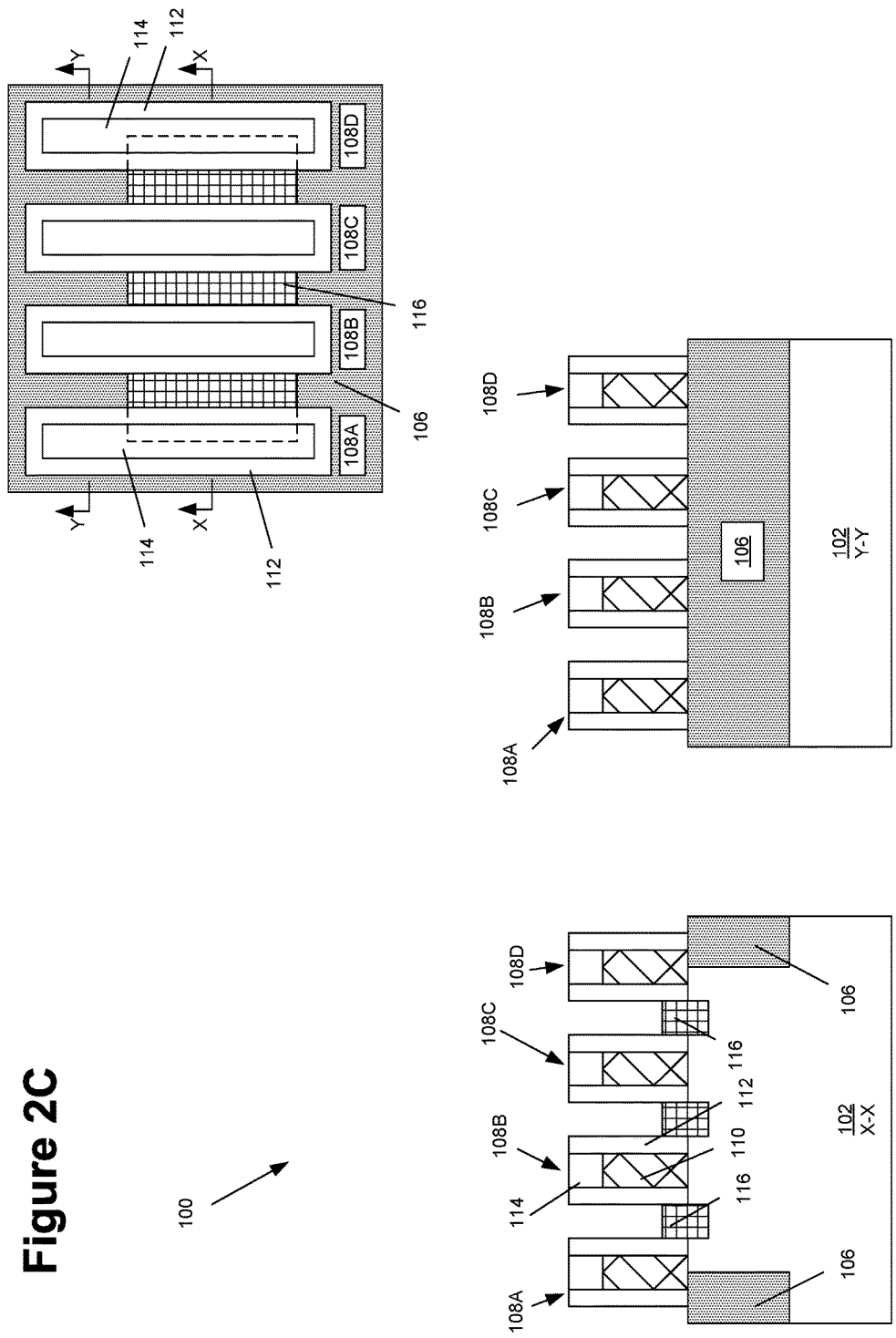
Figure 2D:
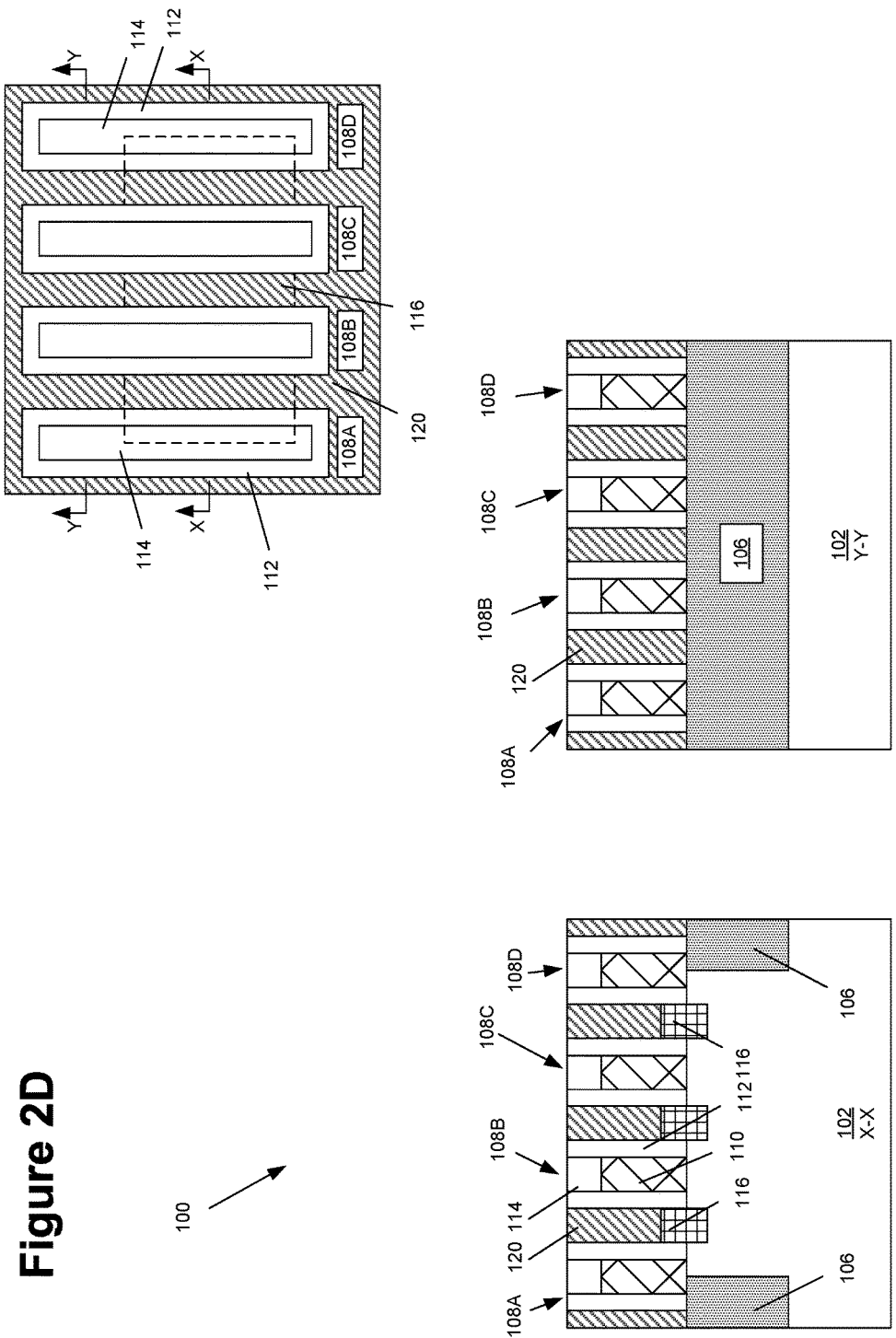
Figure 2E:
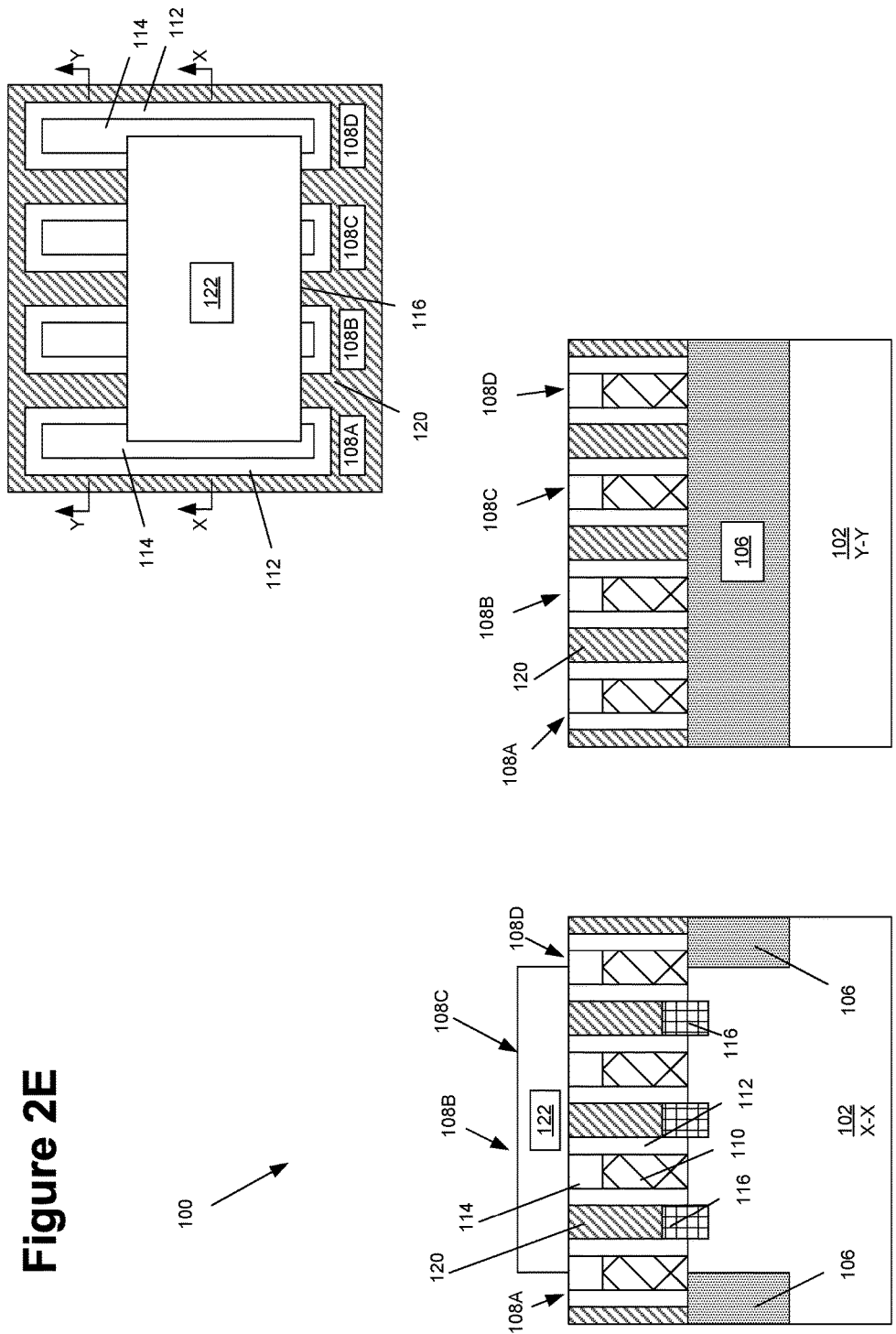
Figure 2F:
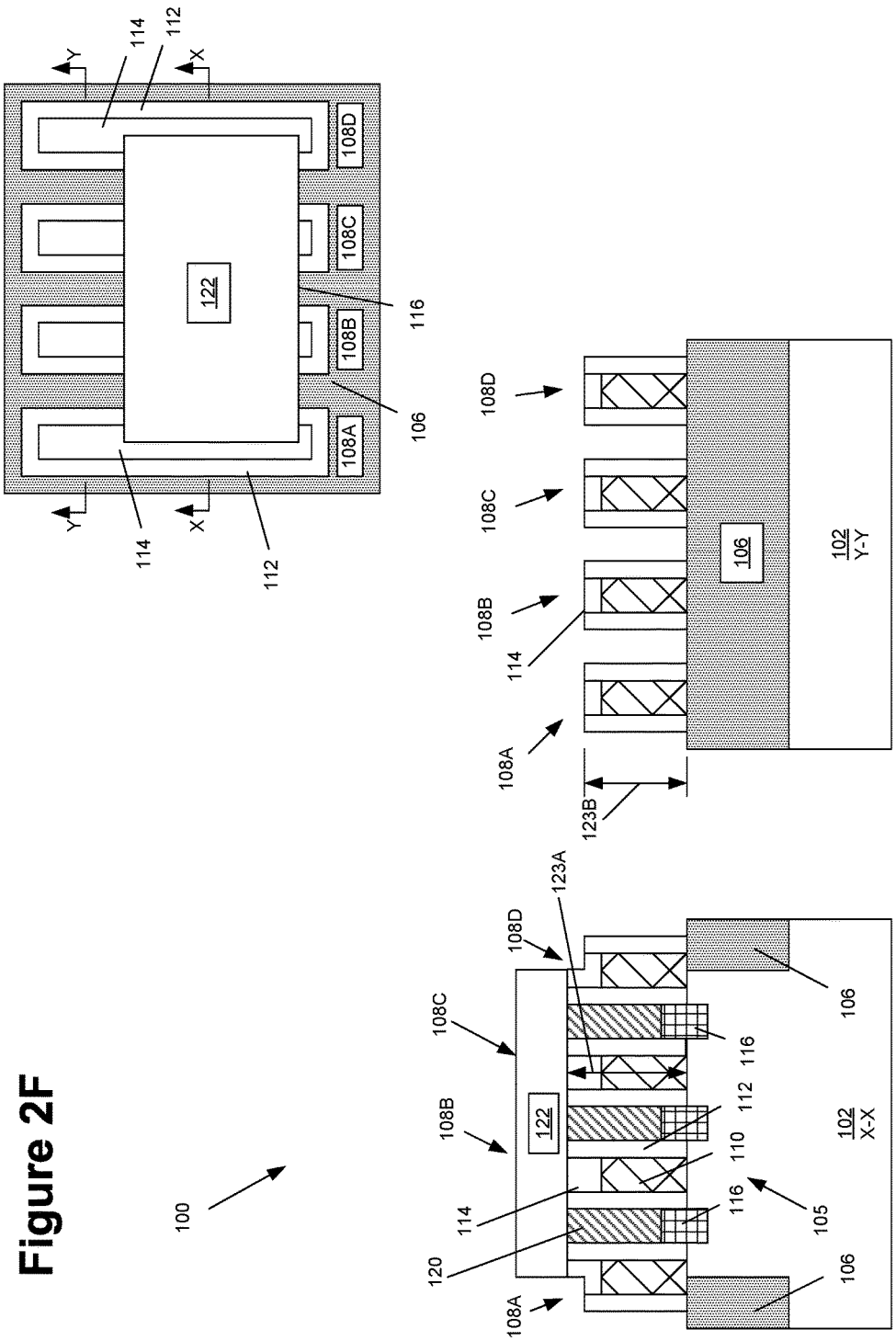
Figure 2G:
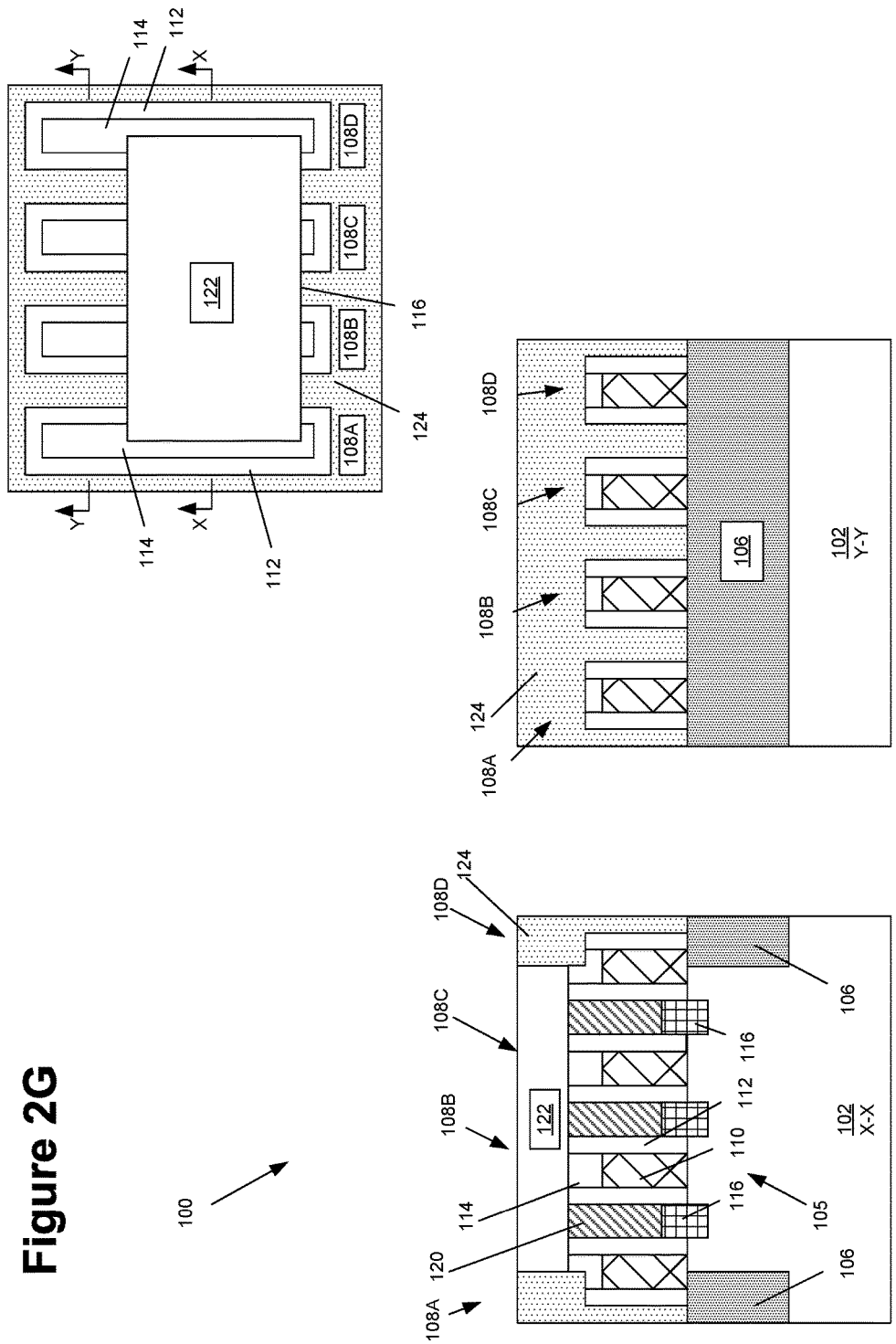
Figure 2H:
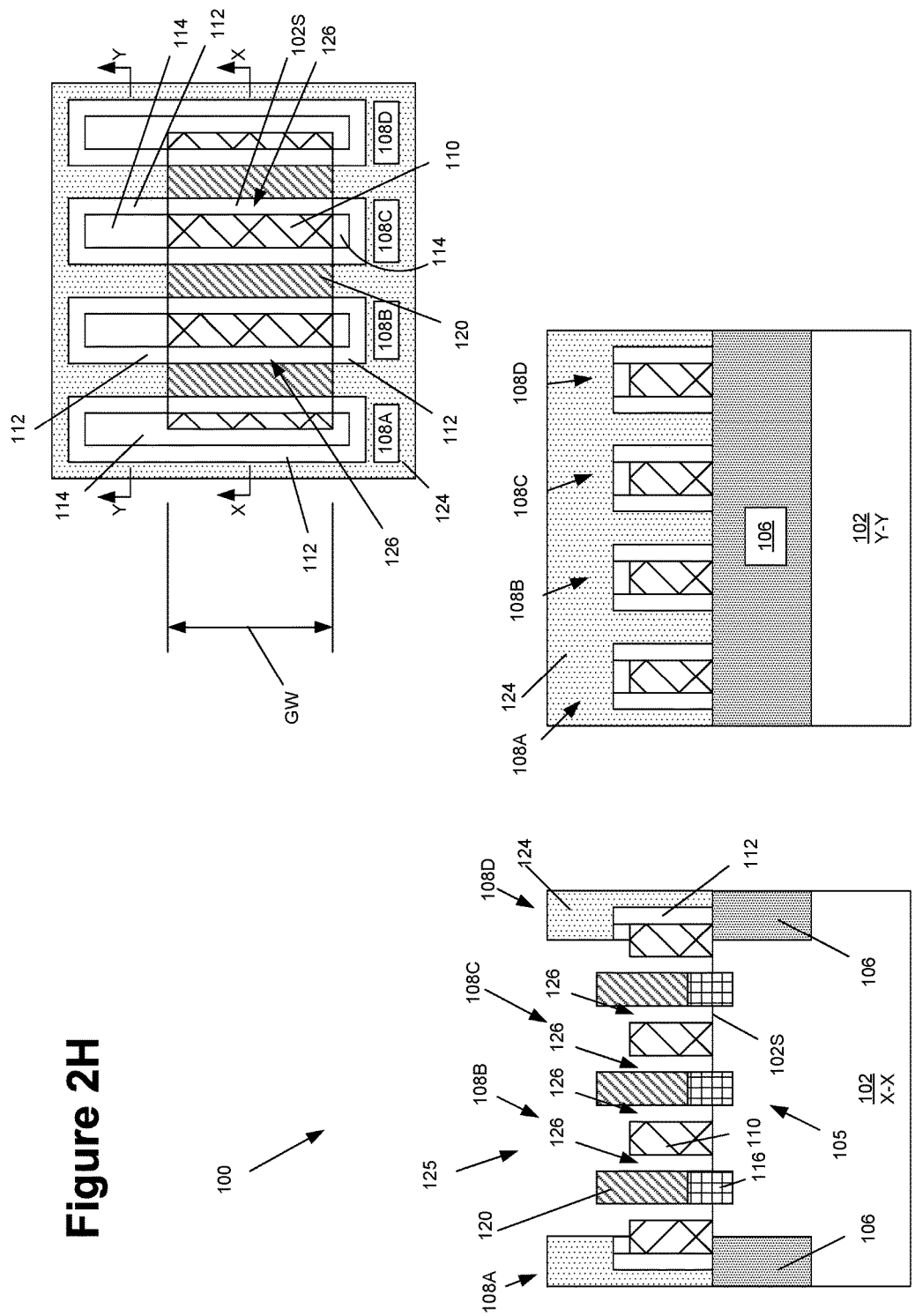
Figure 2I:
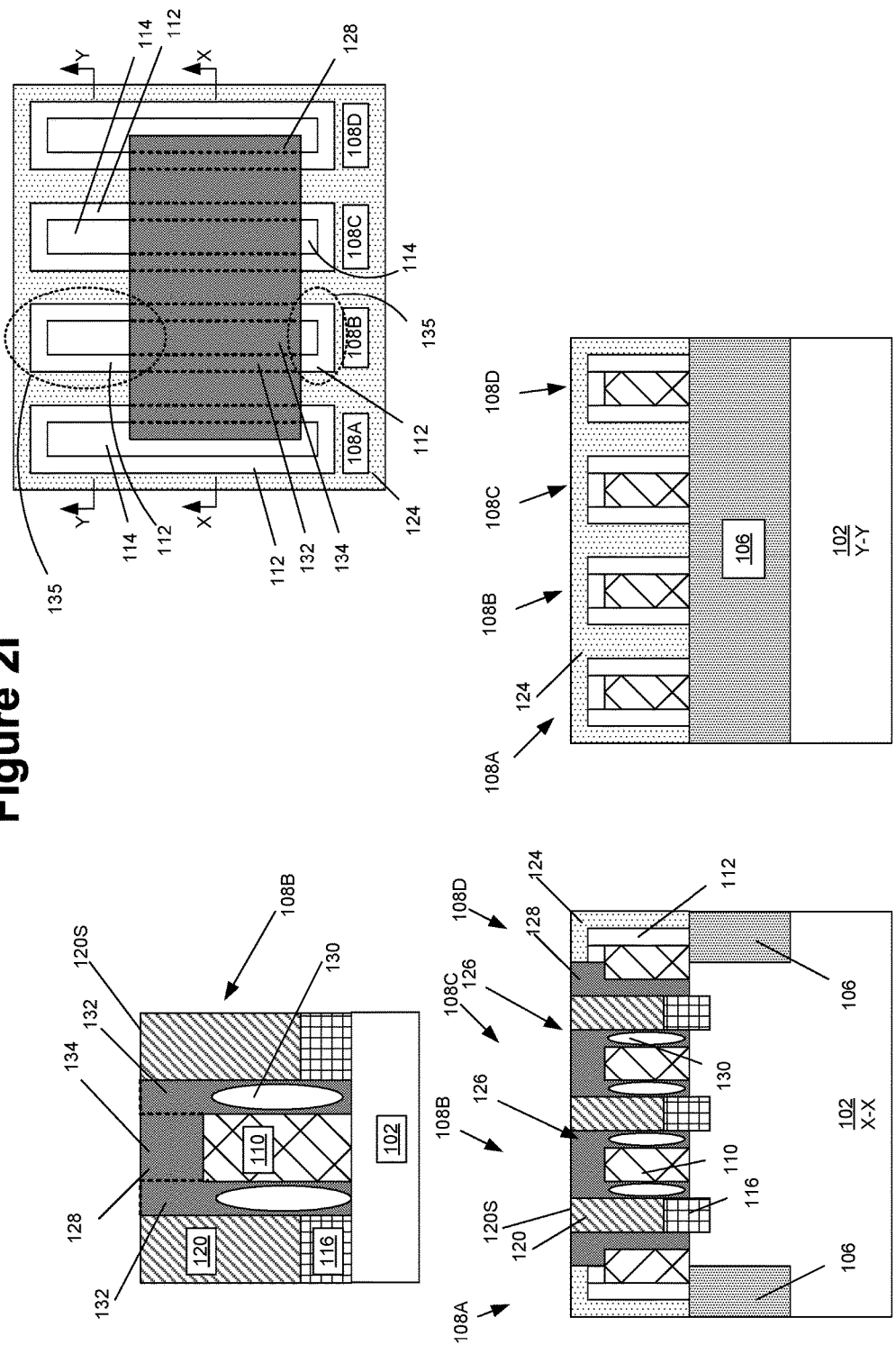
Figure 2J:
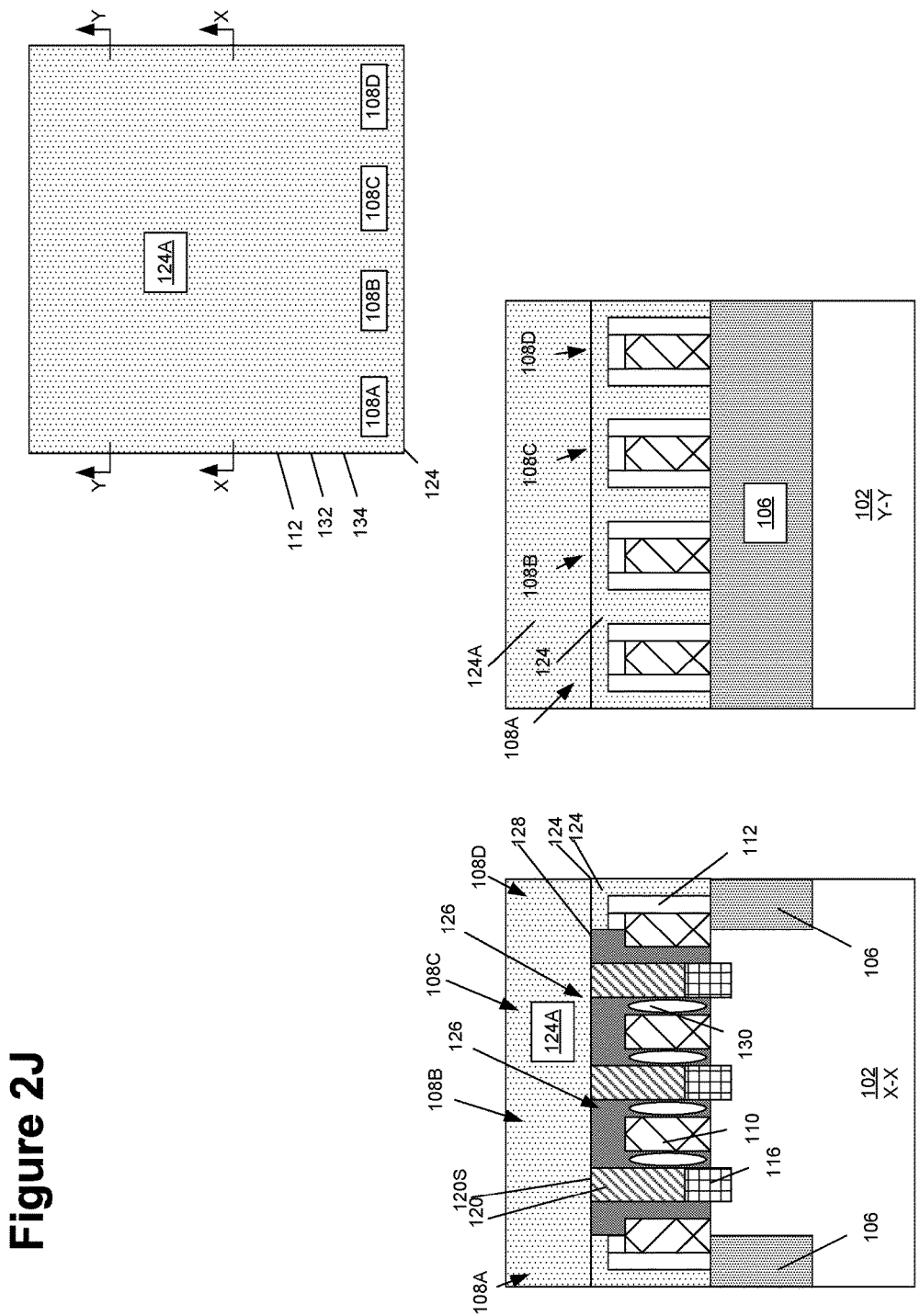
Figure 2K:
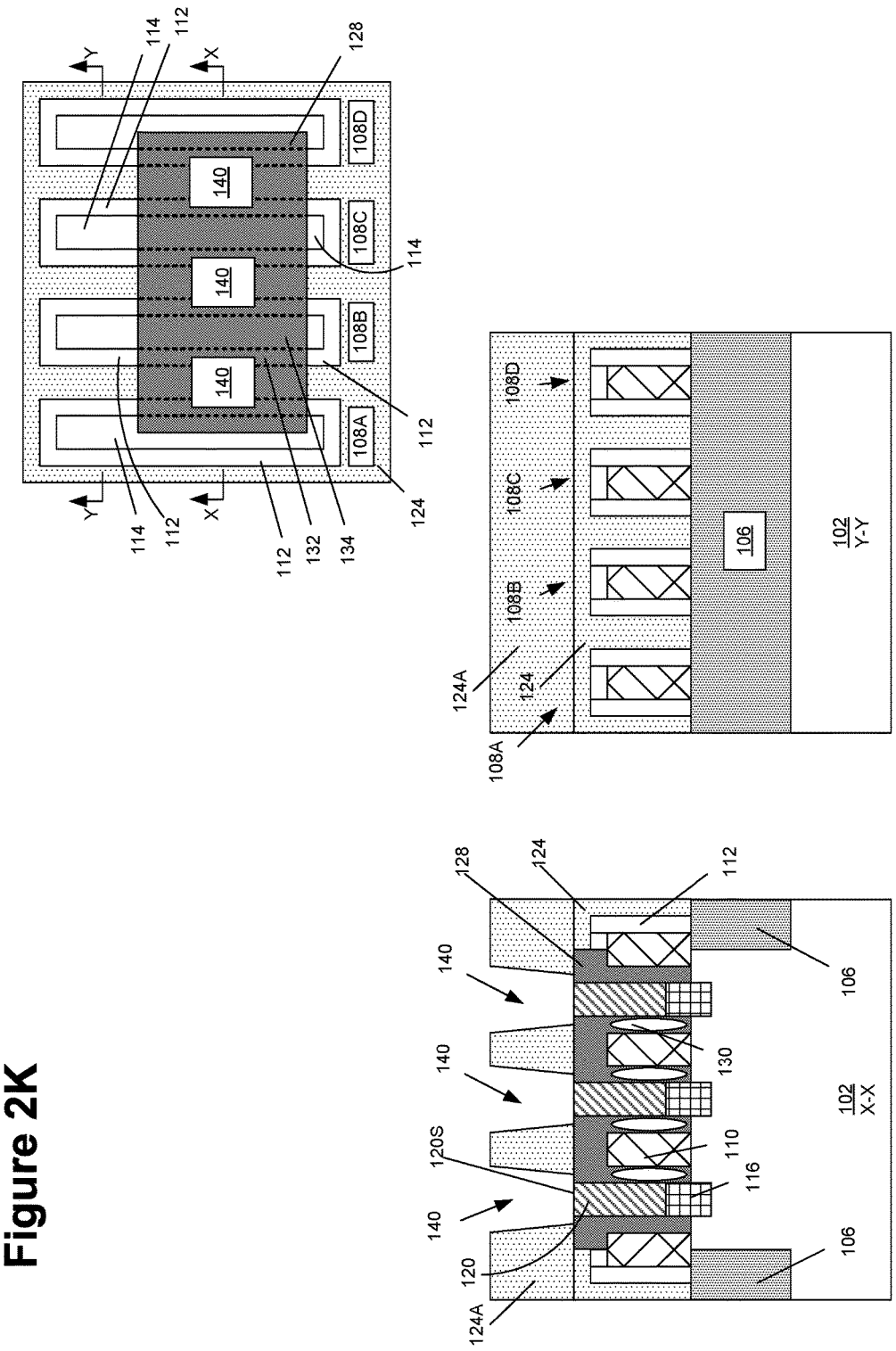
Figure 2L:
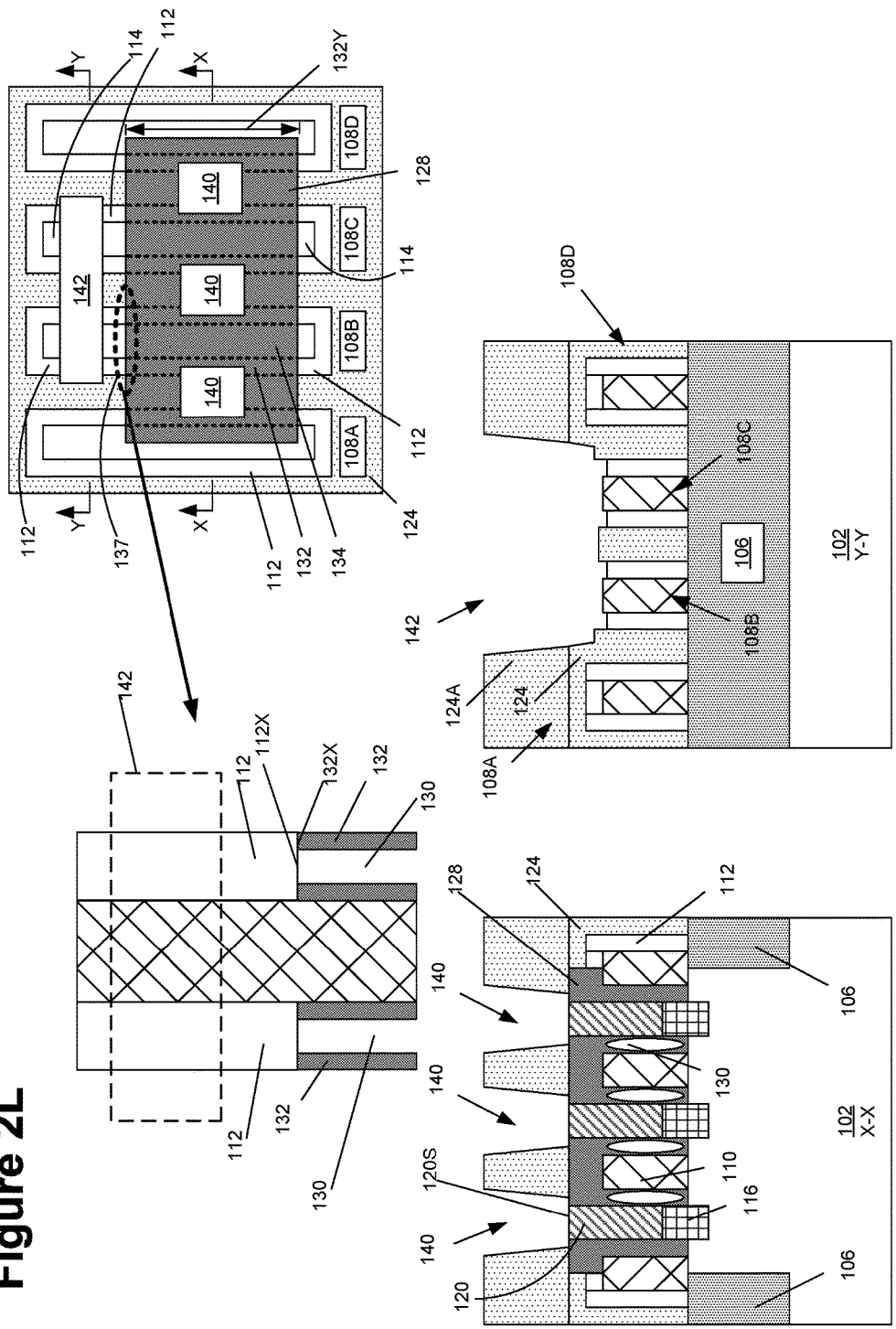
Figure 2N:
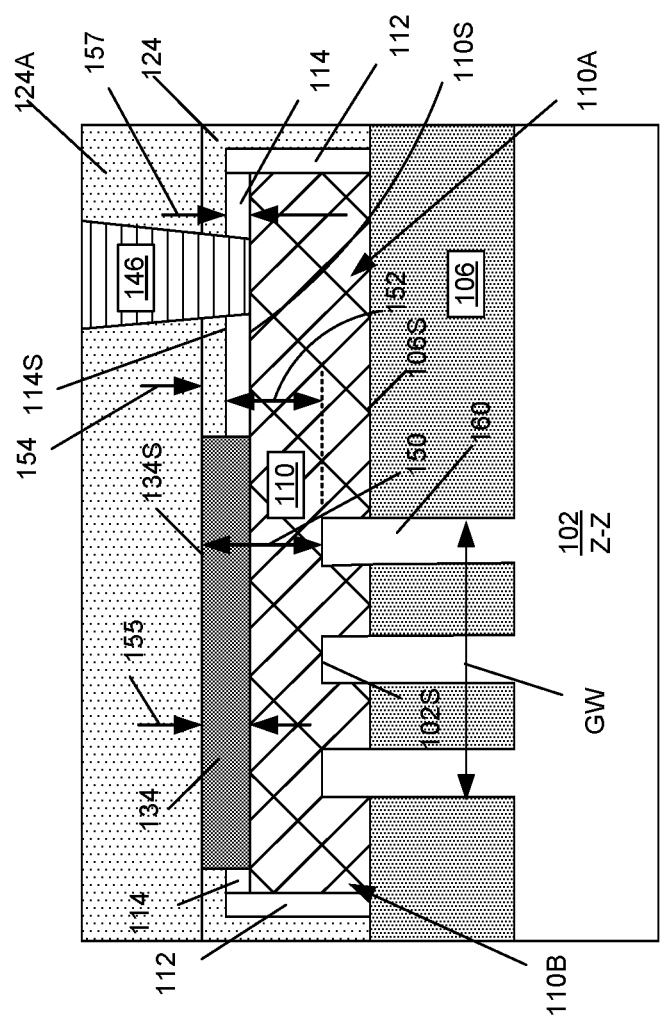

FIGS. 2A-2N depict various methods disclosed herein for forming an air-gap spacer on a semiconductor device and the resulting device. Many of the drawings contain a simplistic plan view of the product 100 in the upper right-hand corner of the drawings. The cross-sectional views depicted in the drawings are taken where indicated in the plan view of the drawings. More specifically, the view X-X is a cross-sectional view taken through the gate structures 108A-D above the active region in a direction parallel to the current transport direction of the devices at a location where the CA contact structures 140 (shown in dashed lines) will be formed. The view Y-Y is a cross-sectional view taken through the gate structures 108A-D above the isolation region 106 (not shown in the plan view) that surrounds the active region at a location where the CB contact structure 142 (shown in dashed lines) will be formed.

The illustrative product 100 will be formed in and above a semiconductor substrate 102. The transistor devices depicted herein may be either NMOS or PMOS transistors, they may be any type of transistor device, e.g., either planar or FinFET transistor devices, and the gate electrode and gate insulation layer of the gate structures of such devices may be formed by performing well-known gate-first or replacement gate processing techniques. Additionally, various doped regions, e.g., halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2A is a cross-sectional view of the integrated circuit product 100 comprised of a plurality of transistor devices formed in and above the semiconductor substrate 102. In some cases, various layers of insulating materials shown in the cross-sectional views may not be depicted in the plan view so as not to obscure the various inventions disclosed herein. At the point of fabrication depicted in FIG. 2A, a schematically depicted isolation region 106, e.g., a shallow trench isolation region comprised of silicon dioxide, has been formed in the substrate 102. The isolation region 106 defines an active region 105 (see view X-X) where the illustrative planar devices will be formed.

With continuing reference to FIG. 2A, four illustrative and schematically depicted overall gate structures 108A-D (collectively 108) have been formed above the substrate 102 at this point in the process flow. In the depicted example, the overall gate structures 108 are comprised of a simplistically depicted gate 110, a gate cap layer 114, and a simplistically depicted sidewall spacer 112. The gate insulation layer of the gate 110 is not separately depicted. A portion of the gate structures 108A-D extends above the isolation region 106. Also depicted in FIG. 2A are epi source/drain regions 116, a contact etch stop layer 117 (e.g., silicon nitride—not shown in the plan view) and a layer of insulating material 119, e.g., silicon dioxide, was formed above the active region 105 and the isolation region 106. The epi source/drain regions 116 may be omitted if desired. In one illustrative embodiment, the gate insulation layer of the gate 110 may be comprised of a variety of different materials, such as, for example, silicon dioxide, a so-called high-k (k greater than 10) insulation material (where k is the relative dielectric constant), etc. Similarly, the gate electrode of the gate 110 may also be of a material such as polysilicon or amorphous silicon, or it may be comprised of one or more metal layers that act as the gate electrode. In the depicted example, the gate structures 108B and 108C are active gate structures for the devices that will be formed above the active region 105 while the gate structure 108A and 108D are "dummy" gate structures as it relates to the devices that will be formed above the active region 105. At the point of fabrication depicted in FIG. 2A, one or more planarization processes were performed on the product 100 after the insulation material 119 was formed on the product using the gate cap layers 114 as a polish-stop.

FIG. 2B depicts the product 100 after an etching process was performed to remove the insulation material 119 using the contact etch stop layers 117 as an etch stop.

FIG. 2C depicts the product 100 after a brief etching process was performed to remove the contact etch stop layers 117.

FIG. 2D depicts the product 100 after conductive material 120 was formed above the product 100. Thereafter, a CMP process was performed to planarize the layer of conductive material 120 using the gate cap layers 114 as a polish stop layer. The layer of conductive material 120 will become part of the conductive contact structure that is formed to establish electrical contact to the epi source/drain regions 116, i.e., trench silicide structures 120. The layer of conductive material 120 may be made from a variety of conductive materials, e.g., tungsten, trench silicide materials, etc.

FIG. 2E depicts the product 100 after a patterned etch mask 122, such as a patterned layer of silicon nitride, was formed above the product 100. The patterned etch mask 122 may be formed by depositing a layer of the material for the etch mask across the product 100 and patterning the layer of masking material using known masking and etching processes. In general, the patterned etch mask 122 covers the portions of the conductive material 120 positioned above the active region 105 that will serve as contact structures 120, e.g., trench silicide structures, to the epi source/drain regions 116.

FIG. 2F depicts the product 100 after an etching process was performed to remove the portions of the conductive material 120 not covered by the patterned etch mask 122. This process operation exposes the isolation region 106. Note that, during this etching process, portions of the gate cap layers 114 and the spacers 112 not covered by the patterned etch mask 122 may also be removed or thinned to at least some degree. As a result, the portions of the gate structures 108B-C under the patterned etch mask 122 (i.e., the portion of the gate structures 108B-C positioned above the active region 105) have a height 123A above the upper surface of the active region 105 that is greater than the height 123B of the gate structures 108A-D not covered by the patterned etch mask 122 (i.e., the portions of the gate structures 108A-D positioned above the isolation region 106). In some cases, the difference in the heights 123A and 123B may be on the order of about 5-30 nm.

FIG. 2G depicts the product 100 after a layer of insulating material 124 was formed above the product 100. Thereafter, a CMP process was performed to planarize the layer of insulating material 124 using the patterned etch mask 122 as a polish stop layer. The layer of insulating material 124 may be made from a variety of insulating materials, e.g., silicon dioxide, SiCO, a low-k material (k value of 3.7 or less), etc.

FIG. 2H depicts the product 100 after one or more etching processes were performed to remove the patterned etch mask 122, the exposed portions of the gate cap layers 114, and the exposed portions of the original spacers 112. This process operation results in the formation of an active region cavity 125 that exposes the conductive contact 120, the gate 110, the upper surface 102S of the substrate 102 and the formation of a plurality of spacer cavities 126 above the active region 105. The spacer cavities 126 extend along the gate 110 for substantially the entire gate width (GW—see plan view) of the devices. As depicted, each of the spacer cavities 126 is positioned laterally between a gate 110 and the combination of the conductive contact 120/epi material 116.

FIG. 2I depicts the product 100 after several process operations were performed. First, a layer of replacement spacer/gate cap material 128 was formed above the product 100 in the active region cavity 125. Thereafter, a planarization process, such as a CMP process or an etch-back process, was performed to planarize the layer of replacement spacer/gate cap material 128 using the upper surface 120S of the conductive contacts 120 as a polish-stop. FIG. 2I contains an enlarged view of the gate structure 108B so as to better depict certain aspects of the various inventions disclosed herein. These process operations result in the formation of a plurality of replacement air-gap spacers 132 with an air-gap 130 formed therein and a replacement gate cap layer 134. During the deposition of the layer of replacement spacer/gate cap material 128, some of the material is formed in the spacer cavities 126 but the process is performed such that the material 128 "pinches-off" and does not completely fill the spacer cavities 126, thereby resulting in the formation of the air-gaps 130. The size and configuration of the air-gaps 130 may vary depending upon the particular application. Although not a requirement, in some applications, the layer of replacement spacer/gate cap material 128 may be made of the same material as that of the original spacers 112 and/or the original gate cap layers 114, but such a situation is not required in all applications. At the end of these process operations, above the active region 105, the gates 110 are encapsulated by the replacement air-gap spacer 132 (with the air gap 130 formed therein) and the replacement gate gap layer 134. Above the isolation region 106, the gates 110 are protected by the solid original spacer 112 (with no air-gap formed therein) and the original gate cap layer 114. Additionally, the ends of the replacement air-gap spacer 132 abut and engage the original spacers 112 while the ends of the replacement gate cap layer 134 abuts and engages the remaining portions of the original gate cap layers 114. Note that the remaining portions of the original spacers 112 define a generally U-shaped structure (see dashed line regions 135) that extends adjacent the sidewalls of the gates 110 and around the end surface of the gates 110 above the isolation region 106.

FIG. 2J depicts the product 100 after another layer of insulating material 124A was formed above the product 100. Thereafter, a CMP process was performed to planarize the layer of insulating material 124A. The layer of insulating material 124A may be made from a variety of insulating materials, e.g., silicon dioxide, SiCO, a low-k material (k value of 3.7 or less), etc., and it may or may not be made of the same material as that of the insulating material 124. In the depicted example, the layers 124, 124A are made of the same material.

FIG. 2K depicts the product 100 after the layer of insulating material 124A was patterned to define a plurality of CA contact openings 140 that expose the upper surface 120S of the conductive (trench-silicide) contacts 120. The layer of insulating material 124A may be patterned by forming a patterned CA etch mask (not shown), such as a patterned layer of photoresist material or OPL, above the layer of insulating material 124A, and thereafter performing an etching process.

FIG. 2L depicts the product 100 after a patterned CB etch mask (not shown), such as a patterned layer of photoresist material or OPL, was formed above the layer of insulating material 124A. The patterned CB etch mask fills the previously formed CA contact openings 140. Thereafter, an etching process was performed through the patterned CB etch mask to define a CB contact opening 142 (for the gate structures 108B, 108C) in the layer of insulating material 124A so as to expose the gates 110. In the illustrative process flow depicted herein, the openings 140 for the CA contacts were formed before the opening 142 for the CB gate contact. In other applications, the CB contact opening 142 may be formed before the CA contact openings 140 for the CA contacts, or the openings for both the CA contacts and the CB contact may be formed at the same time. FIG. 2L contains an enlarged view of a portion of the device in the dashed line region 137. The enlarged view is a cross-section taken at a level below the lower surface of the gate cap layers 114/134. As shown in this enlarged view, the end surface 132X of the air-gap spacer 132 (with the air-gap 130) abuts and engages the end surface 112X of the original spacer 112.

FIG. 2M depicts the device 100 after several process operations were performed to form a CB contact 146 in the CB contact opening 142 and a plurality of CA contacts 144 in the CA contact openings 140. First, the patterned CB etch mask was removed. Thereafter, the openings 140, 142 were over-filled with one or more conductive materials. Next, one or more CMP processes were performed to remove excess conductive material positioned outside of the openings 140, 142 above the layer of insulating material 124A. At this point in the process flow, traditional metallization layers (not shown) may be formed above the product so as to establish electrical contact to the CA contacts 144 and the CB contact 146, i.e., V0 vias may be formed so as to engage the contacts 144, 146 and establish an electrical connection of metal lines in the M1 metallization layer, etc.

FIG. 2M also contains an additional cross-sectional view (Z-Z) taken through the gate structure 108B in the gate width (GW) direction of the device. As depicted, in a planar type device, a central portion of the gate 110 is positioned above the active region 105 and opposite ends 110A, 110B of the gate 110 are positioned above the isolation region 106. The first or original solid sidewall spacer 112 is positioned adjacent the opposite ends 110A, 110B of the gate 110 that are positioned above the isolation region 106. As shown in view Z-Z in FIG. 2M, relative to a common reference surface, e.g., the upper surface 102S of the substrate 102, the gate 110 has a substantially uniform thickness or height above the active region 105 and the isolation region 106. However, there is a difference in the height 150 of the upper surface 134S of the replacement gate cap layer 134 (that is positioned above the active region 105) and the height 152 of the upper surface 114S of the original gate cap layer 114 (positioned above the isolation region 106). The absolute difference 154 in the heights 150 and 152 may vary depending upon the particular application. Stated another way, relative to the upper surface 110S of the gate 110, the replacement gate cap layer 134 has a thickness 155 that is greater than a thickness 157 of the original gate cap layer 114, e.g., about 5-30 nm thicker. As a result, the gate structure 108 of the planar device has a stepped profile when viewed in a cross section (Z-Z) taken through the gate structure in the gate width direction of the device. Additionally, as depicted in the drawings, an air-gap spacer 132 is positioned adjacent each side of the central portion of the gate 110 and above the active region 105 while the remaining portions of the original solid spacer 112 are positioned around the opposite ends 110A, 110B of the gate that are positioned above the isolation region 106. It should also be noted that the original gate cap layer 114 is positioned above the opposite ends 110A, 110B of the gate 110 that are positioned above the isolation region 106 while the replacement gate cap layer 134 is positioned above the central portion of the gate 110, i.e., the portion of the gate 110 that is positioned above the active region 105.

FIG. 2N depicts the view Z-Z shown in FIG. 2M when the device is an illustrative FinFET device comprised of three illustrative fins 160 defined in the substrate 102. In this example, as shown in view Z-Z in FIG. 2N, relative to a common reference surface, e.g., the upper surface 102S of the fins 160 (or the upper surface of the isolation structure 106), there is a difference in the height 150 of the upper surface 134S of the replacement gate cap layer 134 (that is positioned above the active region 105) and the height 152 of the upper surface 114S of the original gate cap layers 114 (positioned above the isolation region 106). As a result, the gate structure 108 of the FinFET device also has a stepped profile when viewed in a cross section (Z-Z) taken through the gate structure in the gate width direction of the device.

As will be appreciated by those skilled in the art after a complete reading of the present application, the methods disclosed herein provide a method of forming an air-gap spacer 132 adjacent the gates 110 above the active region 105 so as to thereby reduce the undesirable gate-to-contact capacitance. Additionally, by keeping the portions of the original spacers 112 (without any air-gaps) that are positioned above the isolation region 106, there is no potential flow path for conductive material that is deposited into the CB gate contact opening 142 to make its way into the air-gap 130 in the air-gap spacer 132. Lastly, the processes disclosed herein were performed without requiring the formation of an additional masking layer so as to protect the spacer 112 in the area where the CB contact 146 will be formed as was the case with the prior art technique discussed in the background section of this application, thereby making the presently disclosed invention less costly and production more efficient.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor device, comprising:
    forming an isolation region in a semiconductor substrate so as to define an active region in said substrate;
    forming a gate structure above said active region and said isolation region, said gate structure comprising a gate, a first gate cap layer and a first sidewall spacer, wherein said first sidewall spacer is positioned around an entire perimeter of said gate and wherein said first sidewall spacer is formed by depositing a layer of spacer material and performing an anisotropic etching process on said layer of spacer material;
    removing portions of said first gate cap layer and said first sidewall spacer that are positioned above said active region, while leaving portions of said first gate cap layer and said first sidewall spacer positioned above said isolation region in place, wherein a plurality of spacer cavities are defined adjacent said gate; and
    forming a replacement air-gap spacer in each of said spacer cavities adjacent said gate and a replacement gate cap layer above said gate, wherein said replacement air-gap spacer comprises an air gap.

2. The method of claim 1, wherein, after forming said gate structure and prior to removing portions of said first gate cap layer and said first sidewall spacer, the method comprises:
    depositing a conductive material above said active region adjacent said gate structure and above said isolation region, wherein said conductive material conductively contacts source/drain regions of said device;
    forming a patterned etch mask that covers said conductive material positioned above said active region and exposes said conductive material positioned above said isolation region; and
    with said patterned etch mask in position, performing at least one etching process to remove portions of said conductive material positioned above said isolation region while leaving portions of said conductive material positioned above said active region in place to as to thereby form conductive source/drain contacts for said device.

3. The method of claim 2, wherein removing portions of said first gate cap layer and said first sidewall spacer that are positioned above said active region further comprises removing said patterned etch mask such that an upper surface of said conductive source/drain contacts is exposed.

4. The method of claim 1, wherein forming said replacement air-gap spacer in each of said spacer cavities adjacent said gate and said replacement gate cap layer above said gate comprises:
    performing a common deposition process to deposit material for said replacement air-gap spacer and said replacement gate cap layer; and
    performing a planarization process on said material for said replacement air-gap spacer and said replacement gate cap layer.

5. The method of claim 4, wherein said planarization process comprises one of a chemical mechanical polishing process or an etch back process, said isolation region comprises silicon dioxide, said replacement gate cap layer is comprised of a same material as a material of said first gate cap layer and said replacement air-gap spacer is comprised of a same material as a material of said first sidewall spacer.

6. The method of claim 1, wherein opposite ends of said replacement air-gap spacer abut and engage remaining portions of said first sidewall spacer, opposite ends of said replacement gate cap layer abut and engage remaining portions of said first gate cap layer and a thickness of said replacement gate cap layer is greater than a thickness of said remaining portions of said first gate cap layer.

7. The method of claim 1, wherein said transistor device is one of a FinFET transistor device or a planar transistor device.

8. The method of claim 1, further comprising:
    forming a plurality of CA contacts, each of which is coupled to one of said conductive source/drain contacts; and
    forming a CB contact that is positioned above said active region and conductively coupled to said gate.

9. A method of forming a transistor device, comprising:
    forming an isolation region in a semiconductor substrate so as to define an active region in said substrate;
    forming a gate structure above said active region and said isolation region, said gate structure comprising a gate, a first gate cap layer and a first sidewall spacer;
    depositing a conductive material above said active region adjacent said gate structure and above said isolation region, wherein said conductive material conductively contacts source/drain regions of said device;
    forming a patterned etch mask that covers said conductive material positioned above said active region and exposes said conductive material positioned above said isolation region;
    performing at least one etching process to remove portions of said conductive material positioned above said isolation region while leaving portions of said conductive material positioned above said active region in place to as to thereby form conductive source/drain contacts for said device;
    forming a layer of insulating material above said substrate adjacent said patterned etch mask;

performing at least one etching process to remove said patterned etch mask and portions of said first gate cap layer and said first sidewall spacer that are positioned above said active region so as to thereby define a plurality of spacer cavities adjacent said gate while leaving portions of said first gate cap layer and said first sidewall spacer positioned above said isolation region in place; and forming a replacement air-gap spacer in each of said spacer cavities adjacent said gate and a replacement gate cap layer above said gate, wherein said replacement air-gap spacer comprises an air gap.

10. The method of claim 9, wherein performing said at least one etching process exposes an upper surface of each of said conductive source/drain contacts.

11. The method of claim 9, wherein forming said replacement air-gap spacer in each of said spacer cavities adjacent said gate and said replacement gate cap layer above said gate comprises:

performing a common deposition process to deposit material for said replacement air-gap spacer and said replacement gate cap layer; and performing a planarization process on said material for said replacement air-gap spacer and said replacement gate cap layer such that an upper surface of said material for said replacement air-gap spacer and said replacement gate cap layer is substantially planar with an upper surface of said layer of insulating material.

12. The method of claim 9, wherein opposite ends of said replacement air-gap spacer abut and engage remaining portions of said first sidewall spacer, opposite ends of said replacement gate cap layer abut and engage remaining portions of said first gate cap layer and a thickness of said replacement gate cap layer is greater than a thickness of said remaining portions of said first gate cap layer.

13. The method of claim 9, further comprising:

forming a plurality of CA contacts, each of which is coupled to one of said conductive source/drain contacts; and forming a CB contact that is positioned above said isolation region and conductively coupled to said gate.

14. The method of claim 9, wherein said first sidewall spacer is positioned around an entire perimeter of said gate and wherein said first sidewall spacer is formed by depositing a layer of spacer material and performing an anisotropic etching process on said layer of spacer material.

15. A transistor device, comprising:

an isolation region that defines an active region in a semiconducting substrate;

a gate structure comprising a gate, wherein a central portion of said gate is positioned above said active region and opposite end portions of said gate are positioned above said isolation region;

a first solid sidewall spacer positioned adjacent said opposite end portions of said gate that are positioned above said isolation region;

an air-gap spacer positioned adjacent each side of said central portion of said gate, said air-gap spacer being positioned above said active region and comprising an air gap, wherein opposite ends of said air-gap spacer abut and engage said first solid sidewall spacer;

a first gate cap layer that is positioned above said opposite end portions of said gate that are positioned above said isolation region;

a second gate cap layer that is positioned above said central portion of said gate positioned above said active region but is not positioned above said first gate cap layer, wherein said second gate cap layer has a thickness when measured in a vertical direction that is perpendicular to an upper surface of said semiconductor substrate that is greater than a thickness of said first gate cap layer when measured in said vertical direction; and a conductive gate contact element positioned above one of said opposite end portions of said gate that is positioned above said isolation region, wherein said conductive gate contact element extends through said first gate cap layer but does not extend through said second gate cap layer.

16. The device of claim 15, wherein at least one of said first solid sidewall spacer and said first gate cap layer are comprised of a different material from said air-gap spacer and said second gate cap layer.

17. The device of claim 15, wherein sidewall surfaces at opposite ends of said second gate cap layer abut and engage adjacent sidewall surfaces of said first gate cap layer.

18. The device of claim 15, wherein said device is one of a FinFET transistor device or a planar transistor device and said gate is comprised of at least one layer of metal.

19. The device of claim 15, further comprising
a plurality of source/drain regions;
a plurality of conductive source/drain contacts, each of which is conductively coupled to one of said plurality of source/drain regions;
a plurality of CA contacts, each of which is coupled to one of said plurality of conductive source/drain contacts; and
a CB contact that is positioned above said isolation region and conductively coupled to said gate.

20. The device of claim 15, wherein said first gate cap layer contacts an upper surface of said opposite end portions of said gate and said second gate cap layer contacts an upper surface of said central portion of said gate.

21. The device of claim 15, wherein said second gate cap layer extends across and covers an entire upper surface of said central portion of said gate, said second gate cap layer contacting said air-gap spacer at each side of said central portion of said gate.

22. The device of claim 15, wherein said second gate cap layer is integrally formed with said air-gap spacer.

23. The device of claim 15, wherein said first gate cap layer comprises a first material and said second gate cap layer comprises a second material that is different from said first material.

* * * * *